US009153304B2

(12) United States Patent
Kulkarni et al.

(10) Patent No.: US 9,153,304 B2
(45) Date of Patent: Oct. 6, 2015

(54) APPARATUS FOR REDUCING WRITE MINIMUM SUPPLY VOLTAGE FOR MEMORY

(76) Inventors: Jaydeep P. Kulkarni, Hillsboro, OR (US); Muhammad M. Khellah, Tigard, OR (US); James W. Tschanz, Portland, OR (US); Bibiche M. Geuskens, Beaverton, OR (US); Vivek K. De, Beaverton, OR (US)

(*) Notice: Subject to any disclaimer, the term of this patent is extended or adjusted under 35 U.S.C. 154(b) by 57 days.

(21) Appl. No.: 13/536,521

(22) Filed: Jun. 28, 2012

(65) Prior Publication Data
US 2014/0003132 A1  Jan. 2, 2014

(51) Int. Cl.
| | |
|---|---|
| G11C 11/00 | (2006.01) |
| G11C 7/22 | (2006.01) |
| G11C 11/419 | (2006.01) |
| G11C 11/412 | (2006.01) |
| G11C 11/413 | (2006.01) |

(52) U.S. Cl.
CPC ............. G11C 7/227 (2013.01); G11C 11/419 (2013.01); *G11C 11/412* (2013.01); *G11C 11/413* (2013.01)

(58) Field of Classification Search
CPC .... G11C 7/227; G11C 11/419; G11C 11/413; G11C 11/412
USPC ............................... 365/154, 226, 230.05, 203
See application file for complete search history.

(56) References Cited

U.S. PATENT DOCUMENTS

| | | | |
|---|---|---|---|
| 6,903,962 B2 * | 6/2005 | Nii | 365/156 |
| 7,113,445 B1 | 9/2006 | Sancheti et al. | |
| 2003/0147275 A1 | 8/2003 | Chang | |
| 2005/0226031 A1 | 10/2005 | Najm et al. | |
| 2005/0226077 A1 * | 10/2005 | Itoh et al. | 365/226 |
| 2006/0056229 A1 * | 3/2006 | Maeda et al. | 365/154 |
| 2007/0183234 A1 * | 8/2007 | Han et al. | 365/203 |
| 2008/0117665 A1 * | 5/2008 | Abeln et al. | 365/154 |
| 2008/0239859 A1 | 10/2008 | Georgakos et al. | |
| 2009/0310398 A1 | 12/2009 | Nguyen | |
| 2011/0032780 A1 * | 2/2011 | Teramoto et al. | 365/189.18 |
| 2012/0106285 A1 * | 5/2012 | De et al. | 365/226 |

FOREIGN PATENT DOCUMENTS

WO   2014/004011 A1   1/2014

OTHER PUBLICATIONS

Notification of Transmittal of the International Search Report and the Written Opinion of the International Searching Authority issued for International Patent Application No. PCT/US2013/044362, mailed Sep. 13, 2013, 10 pages.
Notice of Allowance received for Taiwanese Patent Application No. 102211042, mailed on Oct. 31, 2013, 3 Pages of Notice of Allowance and 1 Pages of English Translation.
International Preliminary Report on Patentability received for International Patent Application No. 2013/44362, mailed Jan. 8, 2015.

* cited by examiner

*Primary Examiner* — Richard Elms
*Assistant Examiner* — Mohammed A Bashar
(74) *Attorney, Agent, or Firm* — Green, Howard & Mughal LLP (57) ABSTRACT

Described is an apparatus for self-induced reduction in write minimum supply voltage for a memory element. The apparatus comprises: a memory element having cross-coupled inverters coupled to a first supply node; a power device coupled to the first supply node and a second supply node, the second supply node coupled to power supply; and an access device having a gate terminal coupled to a word-line, a first terminal coupled to the memory element, and a second terminal coupled to a bit-line which is operable to be pre-discharged to a logical low level prior to write operation.

33 Claims, 6 Drawing Sheets

APPARATUS FOR REDUCING WRITE MINIMUM SUPPLY VOLTAGE FOR MEMORY

BACKGROUND

High-performance microprocessors and system on chips (SoCs) include multiple embedded memory arrays used as register files, low-level caches, etc that typically share the same power supply voltage as the core circuits of the microprocessor. The term "core" herein generally refers to non-peripheral circuits (i.e., non-I/O circuits) that are used for executing machine code. For example, floating point unit, execution unit, arithmetic logic unit, etc are part of the core.

As lower power consumption is becoming a performance benchmark for microprocessors and SoCs, the embedded memory arrays are designed to operate at a wide range of power supplies including the minimum operating voltage (Vmin). The higher end of the wide range of power supplies allow the embedded memory arrays to operate faster at the cost of higher power dissipation while the lower end of the wide range of power supplies allow the embedded memory arrays to operate at lower power dissipation, for example.

The term "minimum operating voltage (Vmin)" herein generally refers to the lowest operating power supply level at which a memory bit-cell can operate successfully for a given performance specification. The term "write Vmin (WVmin)" herein refers generally to the lowest operating power supply level at which a memory bit-cell is able to successfully complete a write operation within a predefined time period.

The WVmin can be reduced by up-sizing the transistors forming the memory cell i.e., by increasing W/L of write-access/pull-up devices of a memory bit-cell. However, such up-sizing increases the overall size of the memory arrays.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

WVmin is limited by contention between the memory bit-cell write-access and pull-up devices (of cross-coupled inverters of the bit-cell) and/or write completion operation.

One way to overcome the limits on WVmin i.e., reduce WVmin, is to increase the size of the write-access/pull-up devices. However such technique increases the overall area and power consumption of the bit-cell, and hence the area of the embedded memory array containing the bit-cell.

Another method for overcoming WVmin limits is to dynamically collapse the power supply (Vcc) of the bit-cell. Such method is referred as "write assist technique" in which the power supply (CVcc) to a column of memory cells is intentionally collapsed momentarily (i.e., reduced from Vcc level to a logical low level e.g., Vss) to overcome the write contention in the bit-cells. However, at lower supply voltage the magnitude/duration of the CVcc collapse in the write assist technique is limited due to the retention of the unselected cells on the same column sharing the same CVcc. Furthermore, conventionally "forced" Vcc-collapse induces uniform Vcc-droop on memory cells for every write operation and assumes the worst case write-limited bit-cell.

At least some or all of the embodiments may solve the problems discussed herein. In one embodiment, a p-device or a stack of p-devices are used to provide power supply to a column of memory cells that share the same CVcc. In one embodiment, the p-device(s) that are coupled between a power supply Vcc (core power supply) and CVcc (power supply to the bit-cell(s)) provide the bit-cell with a weak power supply connection to the power supply Vcc thus allowing a higher power supply droop on the node CVcc. A higher power supply droop on CVcc assists to overcome the contention by the pull-up devices in the bit-cell.

In one embodiment, write bit-lines (WBLs) are pre-discharged to a logical low level (e.g., ground or Vss) before write operation. In such an embodiment, the bit-cell nodes coupled to the pull-up devices and the access transistor(s) are discharged towards the logical low level (e.g., Vss) when write word-line (WWL) is asserted i.e., when the access transistor(s) of the bit-cell are turned on. In such an embodiment, power supply voltage droop on CVcc is automatically achieved through the pull-up devices of the bit-cell i.e., self-induced collapse or reduction of CVcc occurs resulting in lower WVmin.

In one embodiment, after a short time interval, when one of the bit-lines transitions from its pre-discharged level of Vss to Vcc (depending on data polarity), CVcc node recovers from the self-induced collapse and rises towards Vcc (core power supply) allowing the bit-cell to complete the write operation. In this embodiment, the bit-cell operates in a high gain (metastable) region until the bit-lines transition from their pre-discharged levels towards Vcc. In one embodiment, further power savings are materialized by pre-discharging the WBLs from Vcc to Vss during memory inactive state, for example, when the memory is not being used or the processor is in sleep mode. In one embodiment, WVmin is further reduced by delaying WBL relative to WWL. For example, the voltage droop on CVcc increases by having a 30% delay between WBL and WWL.

The embodiments herein describe the memory cell as an eight transistor (8T) Static Random Access Memory (SRAM). However, the embodiments are not limited to 8T SRAMs. The embodiments disclosed herein are applicable to any memory cell having cross-coupled inverting devices that store a bit value which is accessible by one or more access transistors. For example, the embodiments herein are applicable to NT SRAM, where 'N' is an integer which is 4 or greater, a content addressable memory (CAM), etc.

One technical effect of having the apparatus discussed in various embodiments herein that cause self-induced collapse or reduction in the power supply level on CVcc is that the CVcc droop is determined by the strength of the bit-cell devices. As discussed herein, stronger pull-up p-devices of the cross-coupled cells in the bit-cell induce more contention and may result in worst case write limited cell. However, with self-induced collapse or reduction in the power supply on CVcc, stronger pull-up p-devices of the cross-coupled cells in the bit-cell offer higher (self-induced) voltage droop mitigating the impact of stronger contention. Thus, in some embodiments, different bit-cells induce different amounts of droop on CVcc depending on the bit-cell's pull-up device strengths. In such embodiments, bit-cells achieve self-tailored droop on CVcc depending on the strength of the pull-up devices in the cross-coupled cells.

The apparatus discussed in various embodiments herein, that cause self-induced collapse or reduction in the power supply on CVcc, tolerates higher CVcc droop compared to the forced Vcc collapse technique which is governed by the worst case retention. The forced Vcc collapse technique causes intentional act large droop on CVcc which may reduce margin for retention for unselected memory cells on the same CVcc node. Conversely, the self-induced collapse or reduction in the power supply on CVcc allows for higher margin for retention.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "scaling" herein refers generally to transferring the circuit design and layout from one process technology to another process technology. The term "substantially," "about," "approximately," herein refers to being within +/−10-20% of a target value.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

Figure 1:
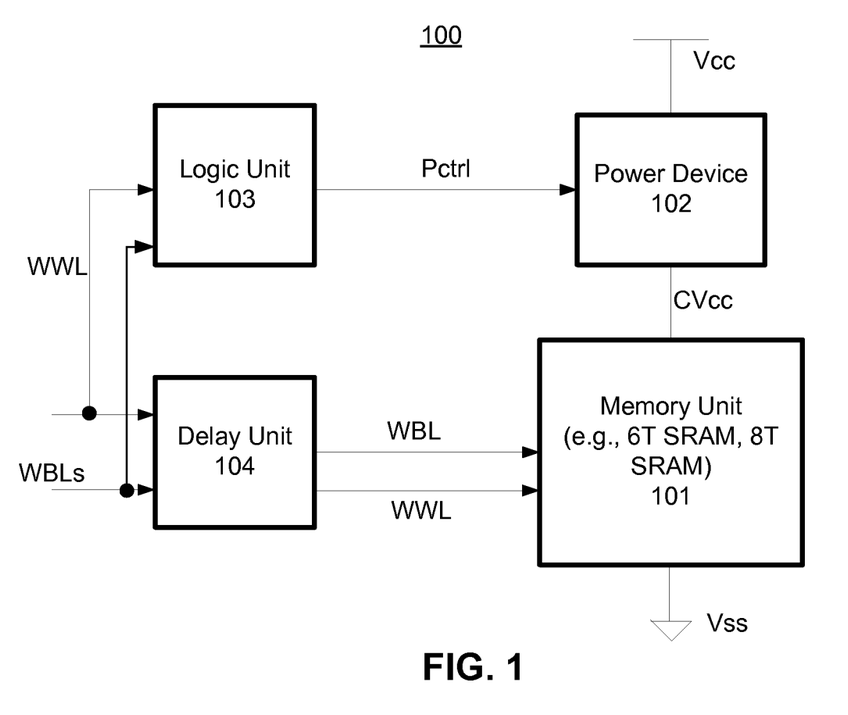
FIG. 1 is a high level apparatus for reducing write minimum supply voltage (Vmin) for a memory unit, according to one embodiment of the disclosure.

FIG. 1 is a high level apparatus 100 for reducing WVmin for a memory unit, according to one embodiment of the disclosure. In one embodiment, the apparatus comprises a memory unit 101, a power device 102, a logic unit 103, and a delay unit 104. In one embodiment, the memory unit 101 comprises one or more bit-cells having cross-coupled devices. In one embodiment, the memory unit 101 is a 6T SRAM. In another embodiment, the memory unit 101 is an 8T SRAM.

In one embodiment, a power device 102 is coupled to the memory unit 101. In this embodiment, the power device 102 provides a weak connection of Vcc to CVcc node, where CVcc node provides power to the memory unit while Vcc is the main power supply (or core power supply).

In one embodiment, the power device 102 comprises one or more p-type devices coupled between Vcc and CVcc. In one embodiment, the one or more p-type devices are always on. In other embodiments, the one or more p-type devices are controlled (i.e., turned on or off) by pctrl signal generated by a logic unit 103.

In one embodiment, the logic unit 103 generates pctrl signal to turn on the power device 102 when the WBL is pre-discharged to a logical low level (e.g., Vss). During this embodiment, write-word line (WWL) is asserted i.e., on. In one embodiment, the logic unit 103 generates pctrl signal to turn off the power device 102 when the WBLs are pre-discharged to the logical low level during the write operation.

In one embodiment, pctrl causes the power device 102 to be turned OFF only during the write operation (when WWL is ON) and when both WBLs (WBL and WBLx) are pre-discharged to logical low level e.g., Vss. In one embodiment, in standby mode, pctrl signal causes the power device 102 to be ON to retain the data in the bit-cell.

In one embodiment, the logic unit 103 comprises a logical NOR gate which applies a logical NOR operation on the write bit-lines (WBL and WBLx), the output of which is logically ANDed with the write word-line (WWL). In one embodiment, the logic unit 102 is a pulse generating logic, where the pctrl signal is a pulse signal.

In one embodiment, the delay unit 104 is operable to delay WBL relative to WWL during write operation. In one embodiment, the delay between WBL and WWL is programmable by software or hardware. In one embodiment, the delay is set to 20-30% of a clock phase (e.g., WR CLK of FIG. 4). In other embodiments, the delay is set to a different percentage of the clock phase.

Figure 2:
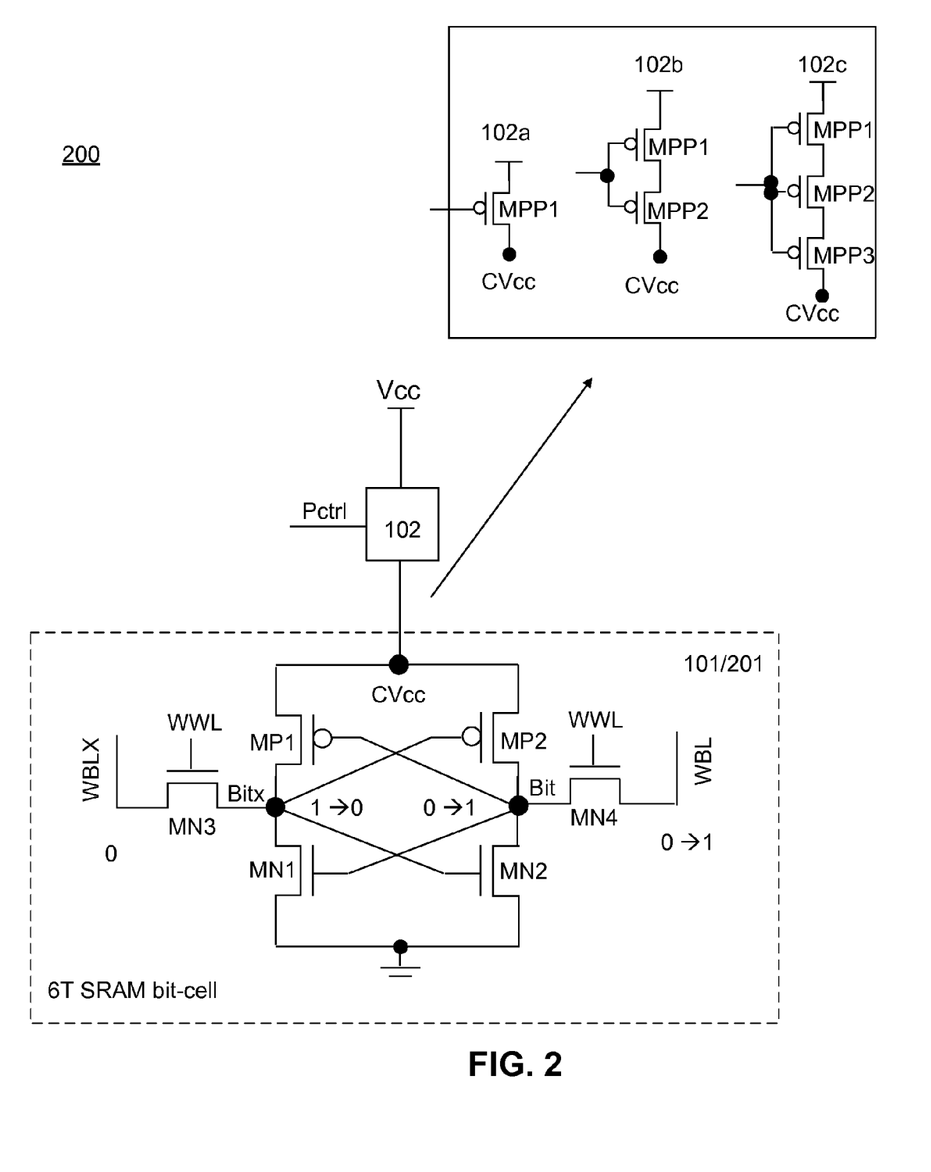
FIG. 2 is a memory bit-cell with a power device for self-induced reduction in write Vmin (WVmin), according to one embodiment of the disclosure.

FIG. 2 is a circuit 200 with a memory bit-cell 101/201 coupled to the power device 102 for self-induced reduction in WVmin, according to one embodiment of the disclosure. In this embodiment, a 6T SRAM cell is coupled to the power device 102. A 6T SRAM cell 101/201 is well known and is not described in detail. The 6T SRAM cell 101/201 comprises cross-coupled devices—back to back inverters—MP1, MN1, MP2, and MN2; and at least two access devices MN3 and MN4. Access device MN3 is controlled by WWL and couples WBLx to Bitx node. Access device MN4 is controlled by WWL and couples WBL to Bit node.

Various embodiments of the power device 102 are shown as 102a, 102b, and 102c. In one embodiment, the power device 102a comprises a p-type device MPP1 with its source and drain terminals coupled between Vcc and CVcc respectively, and its gate terminal controlled by pctrl signal. In another embodiment, the power device 102b comprises two p-type devices MPP1 and MPP2 coupled in series with one another as shown. In another embodiment, the power device 102c comprises three p-type devices MPP1, MPP2, and MPP3 coupled in series with one another as shown. In other embodiments, more p-type transistors may be used between Vcc and CVcc. In some embodiments, the p-device(s) have programmable strengths. In one embodiment, the strengths of the p-device(s) are programmable by having multiple devices in parallel to one another.

In one embodiment, a group of bit-cells in a column share the same CVcc node. In one embodiment, the size of the group of bit-cells is one of: 4, 8, and 16. In other embodiments, other numbers of bit-cells form a group having the common node CVcc. The numbers of bit-cells forming the group depends on the amount of droop on CVcc and time to complete write operation.

While the embodiments herein describe series coupled p-devices, combination of series and parallel transistors (p and/or n-type devices) may be used to provide the appropriate resistance for causing a sufficient droop on CVcc when the power device 102 is on. In some embodiments, the combination of series and parallel transistors may have some transistors that have programmable strengths.

In one embodiment, WBLs are pre-discharged to a logical low level (e.g., ground or Vss) before write operation. In such an embodiment, the bit-cell nodes coupled to the pull-up devices and the access transistor(s) are discharged towards the logical low level (e.g., Vss) when WWL is asserted i.e., when the access transistor(s) of the bit-cell are turned on. In such an embodiment, power supply voltage droop on CVcc is automatically achieved through the pull-up devices MP1 and MP2 of the 6T SRAM bit-cell 101/201 i.e., self-induced collapse or reduction of CVcc occurs.

In one embodiment, WBLs are pre-discharged to a logical low level (e.g., ground or Vss) before write operation. In such an embodiment, the nodes Bitx and Bit coupled to the pull-up devices MP1 and MP2 and the access transistors MN3 and MN4 respectively are discharged towards the logical low level (e.g., Vss) when WWL is asserted i.e., when the access transistors MN3 and MN4 of the 6T SRAM bit-cell 101/201 are turned on. In such an embodiment, power supply voltage droop on CVcc is automatically achieved by the power device 102 through the pull-up devices MP1 and MP2 of the 6T SRAM bit-cell 101/201 i.e., self-induced collapse or reduction of CVcc occurs.

In one embodiment, after a short time interval when one of the bit-lines transitions from its pre-discharged level of Vss to Vcc (depending on data polarity), CVcc node recovers from the self-induced collapse and rises towards Vcc (core power supply) via the power device 102 allowing the 6T SRAM bit-cell 101/201 to complete the write operation. In this embodiment, the 6T SRAM bit-cell 101/201 operates in a high gain (meta-stable) region till the bit-lines transition from their pre-discharged levels towards Vcc.

Figure 3:
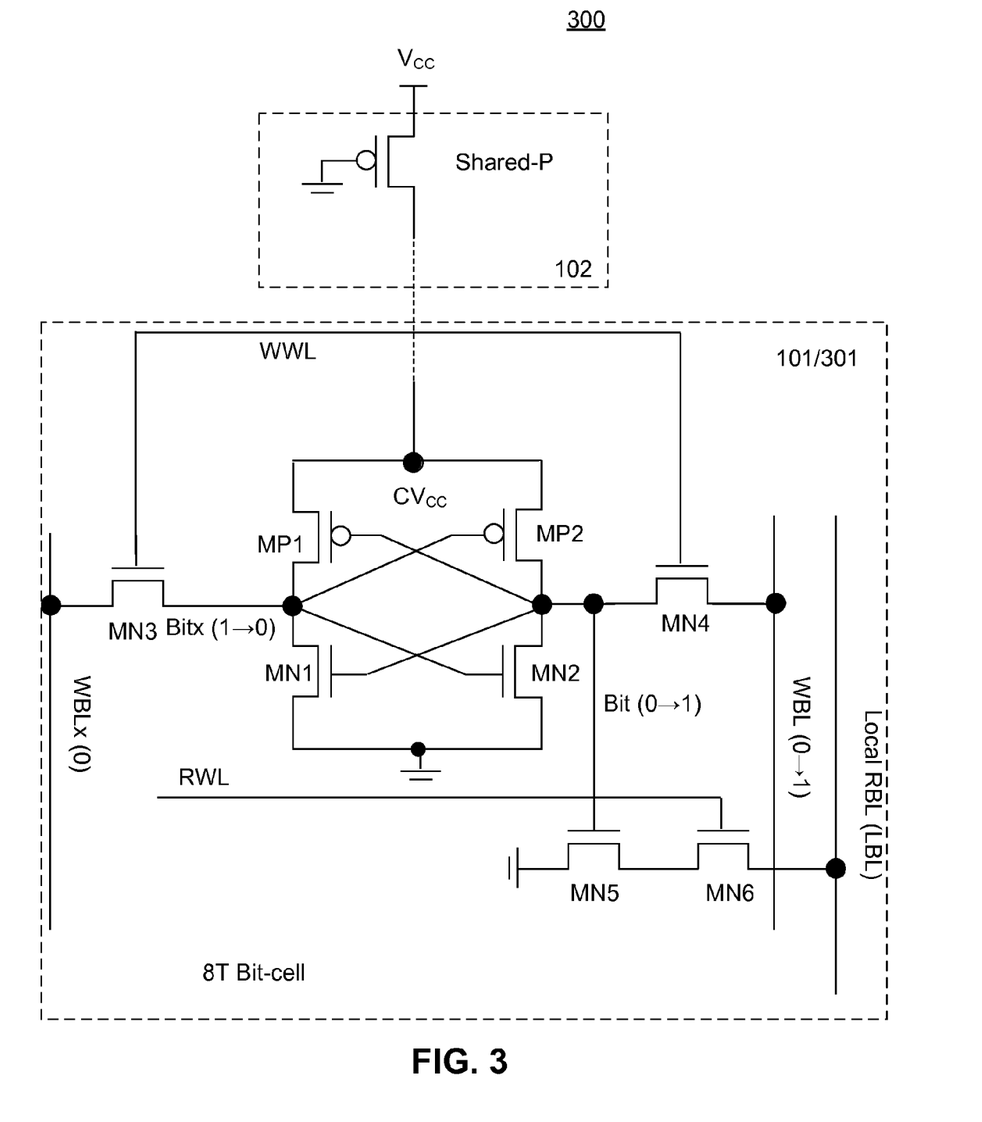
FIG. 3 is another memory bit-cell with a power device for self-induced reduction in WVmin, according to one embodiment of the disclosure.

FIG. 3 is a circuit 300 with another memory bit-cell coupled to a power device for self-induced reduction in write Vmin, according to one embodiment of the disclosure. In this embodiment, the memory bit-cell is an 8T SRAM bit-cell 101/301. An 8T SRAM bit-cell 101/301 is well known and so it is not discussed in detail. The two additional transistors over the 6T SRAM 101/201 of FIG. 2 are MN5 and MN6 which are coupled in series. The gate terminal of MN5 is coupled to the node Bit. The source terminal of MN5 is coupled to a logical low level (e.g., ground or Vss). The drain terminal of MN5 is coupled to the source terminal of MN6. The gate terminal of MN6 is controlled by a read word-line signal (RWL). The drain terminal of MN6 is coupled to a local read bit-line (LBL).

The 8T SRAM bit-cell 101/301 has decoupled read and write ports that are operable to provide fast read and write operations with generally lower WVmin than the WVmin of the 6T SRAM cell 101/201 of FIG. 2. Referring back to FIG. 3, in one embodiment the power device 102 is used to provide a weak power supply to node CVcc as discussed with reference to FIG. 2.

In one embodiment, WBLs are pre-discharged to a logical low level (e.g., ground or Vss) before write operation. In such an embodiment, the bit-cell nodes coupled to the pull-up devices and the access transistor(s) are discharged towards the logical low level (e.g., Vss) when WWL is asserted i.e., when the access transistor(s) of the bit-cell are turned on. In such an embodiment, power supply voltage droop on CVcc is automatically achieved through the pull-up devices MP1 and MP2 of the 8T SRAM bit-cell 101/301 i.e., self-induced collapse or reduction of CVcc occurs.

In one embodiment, WBLs are pre-discharged to a logical low level (e.g., ground or Vss) before write operation. In such an embodiment, the nodes Bitx and Bit coupled to the pull-up devices MP1 and MP2 and the access transistors MN3 and MN4 respectively are discharged towards the logical low level (e.g., Vss) when WWL is asserted i.e., when the access transistors MN3 and MN4 of the 8T SRAM bit-cell 101/301 are turned on. During this time, RWL is logically low.

In such an embodiment, power supply voltage droop on CVcc is automatically achieved by the power device 102 through the pull-up devices MP1 and MP2 of the 8T SRAM bit-cell 101/301 i.e., self-induced collapse or reduction of CVcc occurs.

In one embodiment, after a short time interval when one of the bit-lines transitions from its pre-discharged level of Vss to Vcc (depending on data polarity), CVcc node recovers from the self-induced collapse and rises towards Vcc (core power supply) via the power device 102 allowing the 8T SRAM bit-cell 101/301 to complete the write operation. In this embodiment, the 8T SRAM bit-cell 101/301 operates in a high gain (meta-stable) region till the bit-lines transition from their pre-discharged levels towards Vcc.

In one embodiment, further power savings are materialized by pre-discharging the WBLs from Vcc to Vss during memory inactive state, for example, when the memory is not being used or the processor is in sleep mode. In one embodiment, WVmin is further reduced by delaying WBL relative to WWL. For example, the voltage droop on CVcc increases by having a 30% delay between WBL and WWL.

Figure 4:
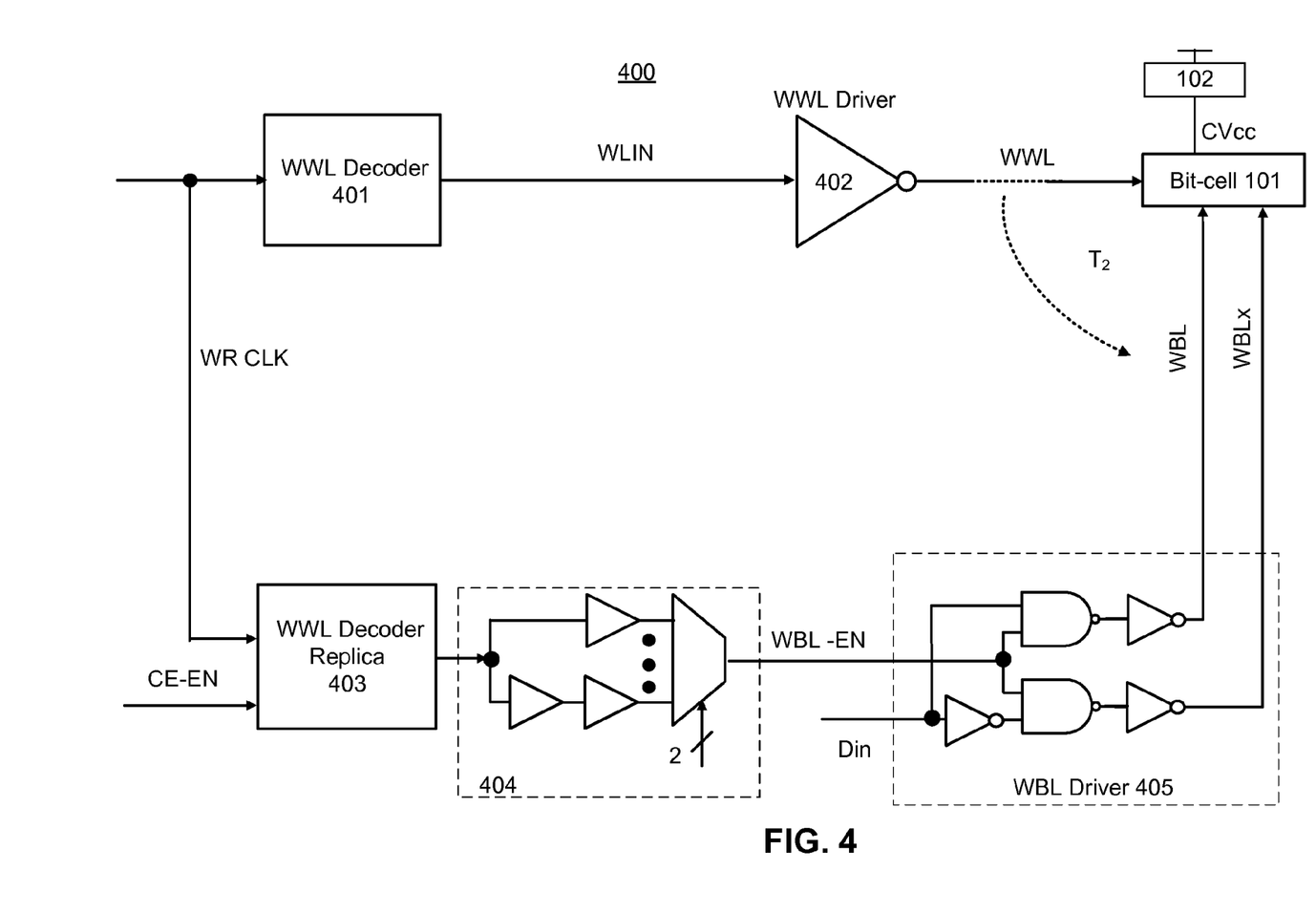
FIG. 4 is a high level architecture of logic units for generating control signals to enable self-induced reduction in WVmin, according to one embodiment of the disclosure.

FIG. 4 is a high level architecture 400 of logic units for generating control signals to enable self-induced reduction in WVmin, according to one embodiment of the disclosure. In one embodiment, the architecture 400 comprises a WWL decoder 401, WWL driver 402, WWL replica decoder 403, programmable delay unit 404, and a WBL driver 405 to provide WBL and WBLx signals to the bit-cell 101. In one embodiment, the WWL replica decoder 403 tracks the delay from assertion/de-assertion of clock signal (CLK) to WWL across process voltage and temperature (PVT) conditions. In one embodiment, the programmable delay unit 404 adjusts the WWL to WBL delay.

In one embodiment, the WWL decoder 401 decodes the word line to access the appropriate column of bit-cells.

Depending on the address inputs, one of the word-line decoder output is logical high and selects the particular row of bit-cells for the write operation. In one embodiment, the output WLIN of the WWL decoder 401 is received by the WWL driver 402 that generates the WWL signal such that WWL signal transitions prior to the WBL signal. In one embodiment, the WWL driver 402 is an inverter. In one embodiment, the WBL driver 405 is a dynamic driver which is used to pre-discharge both bit-lines to to Vss.

In one embodiment, the delay unit 404 comprises programmable inverter delay chains to set the WWL to WBL delay during the write operation. In one embodiment, the data inputs are logically ANDed with a bit-line enable signal (WBL-EN) to apply appropriate logic values on the WBL and WBLx after time interval T2.

Figure 5:
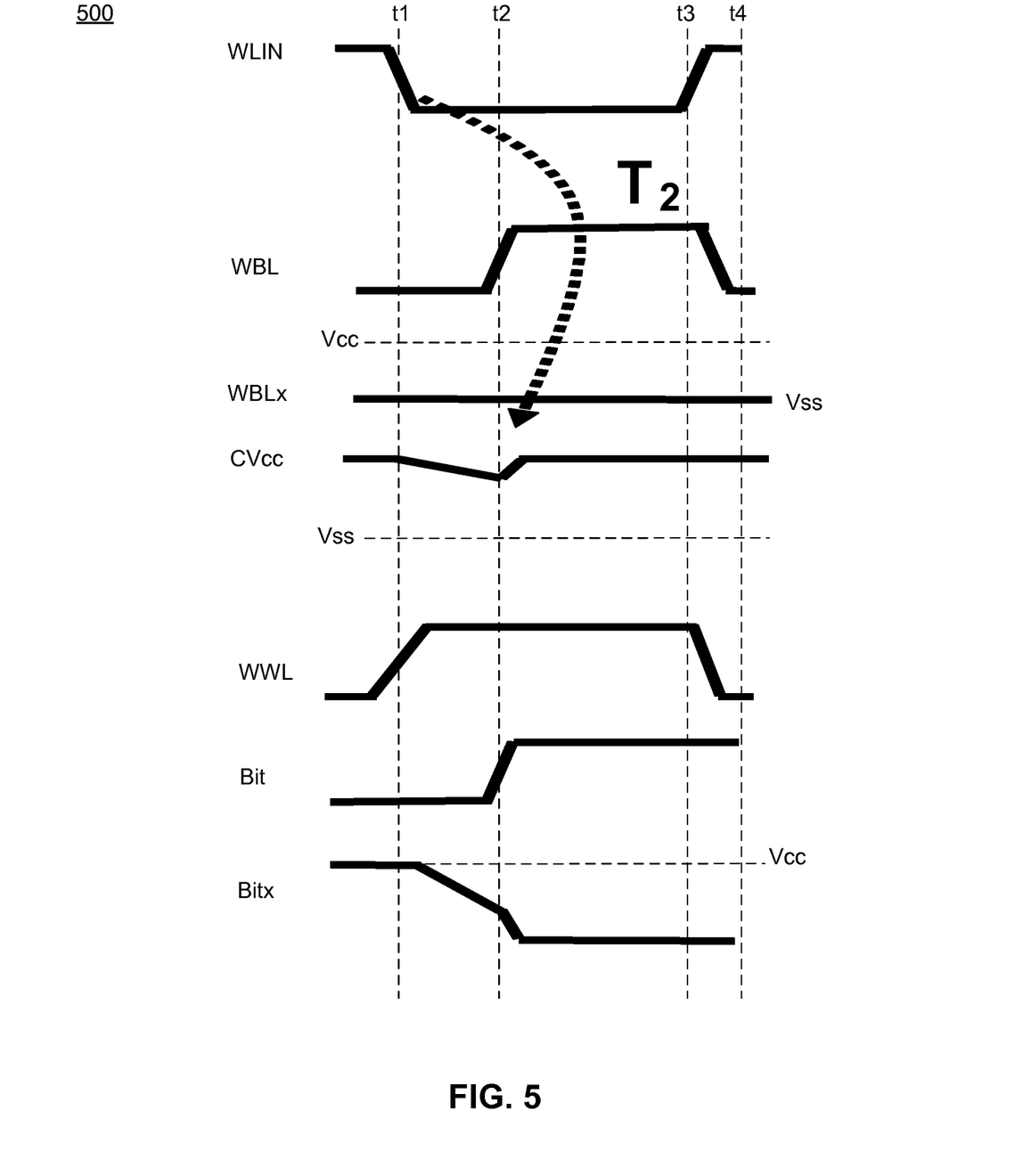
FIG. 5 are waveforms at various nodes of the memory bit-cell illustrating the self-induced reduction in WVmin, according to one embodiment of the disclosure.

FIG. 5 are waveforms 500 at various nodes of the memory bit-cell 101/201/301 illustrating the self-induced reduction in write Vmin according to one embodiment of the disclosure. In this illustration, the x-axis is time while the y-axis is voltage, the horizontal dashed lines are either Vcc or Vss as indicated while the vertical dashed lines are time points t1-t4. The waveforms are explained with reference to FIGS. 1-4.

WBL is delayed relative to WLIN by programmable amount $T_2$. As discussed herein, by delaying WBL relative to WWL (or WLIN), additional WVmin reduction is observed. The signals Bit and Bitx assert and de-assert respectively at t2. At t3, WLIN transitions from logical low to logical high level indicating end of the write operation. At t4, the signals transition to their steady state levels indicating end of the write operation. At t4, next write operation can be initiated.

Figure 6:
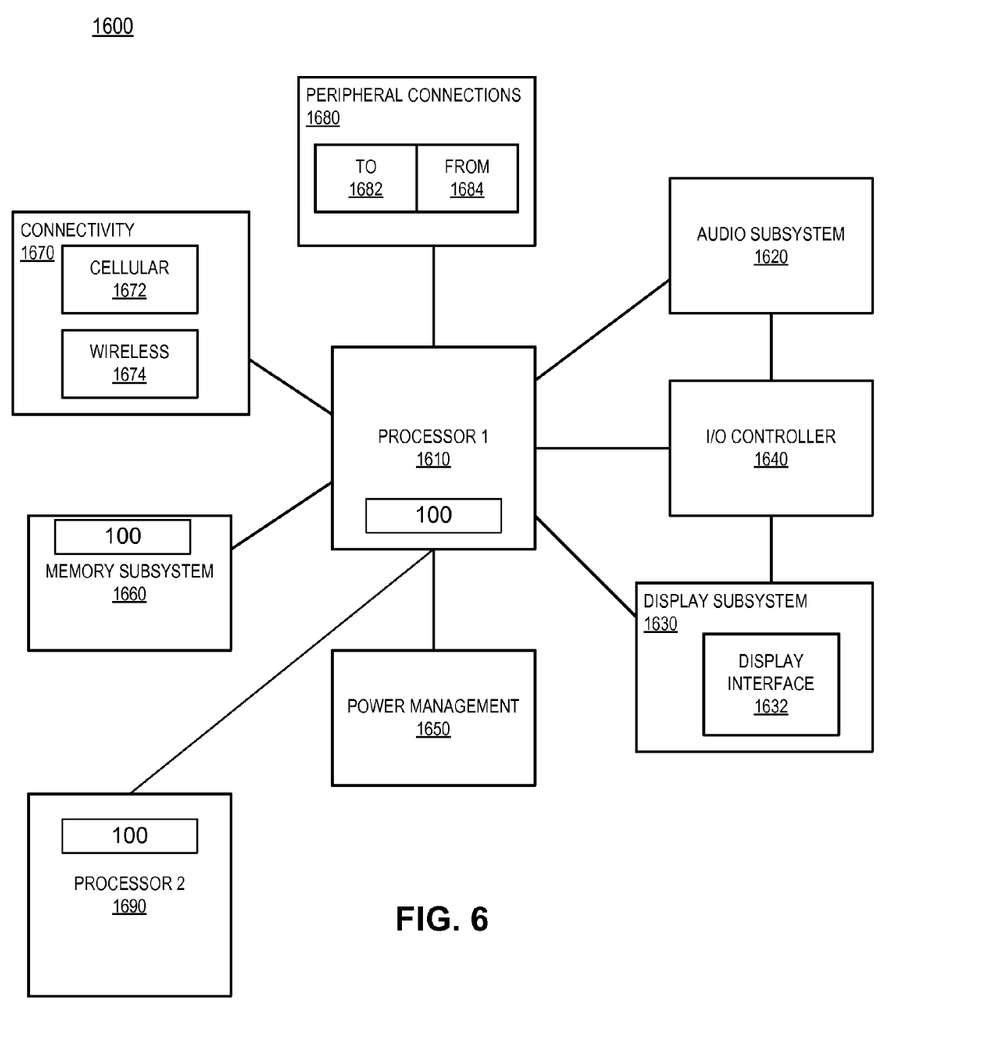
FIG. 6 is a system-level diagram of a smart device comprising the apparatus for reducing WVmin for a memory unit, according to one embodiment of the disclosure.

FIG. 6 is a system-level diagram of a computing device 1600 (e.g., smart device) comprising a processor having the apparatus for self-induced reduction in WVmin in one or more memory cells, according to one embodiment of the disclosure. FIG. 6 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600.

In one embodiment, the computing device 1600 includes a first processor 1610 with the apparatus 100 for self-induced reduction in WVmin in one or more memory cells and a second processor 1690 with the apparatus 100 for self-induced reduction in WVmin in one or more memory cells. In one embodiment, the apparatus 100 is also used in the memory subsystem 1660.

The various embodiments of the present disclosure may also comprise a network interface within 1670 such as a wireless interface so that a system embodiment may be incorporated into a wireless device such as cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description.

For example, "write assist technique" may be combined with the power device 102 that provides self-induced droop on CVcc. In one embodiment, a pull-down device (not shown) is coupled to CVcc node to pull the CVcc node to ground or logical low level to collapse CVcc for reducing WVmin. In one embodiment, the pull-down device is enabled to collapse CVcc when it is determined that the self-induced reduction to CVcc by the power device 102 is not enough to cause a reduction in WVmin because the contention in the bit-cell is not resolved. In other embodiments, the pull-down device is enabled as a backup WVmin reduction technique.

The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment the apparatus comprises a memory element having cross-coupled inverters coupled to a first supply node; a power device coupled to the first supply node and a second supply node, the second supply node coupled to power supply; and an access device having a gate terminal coupled to a word-line, a first terminal coupled to the memory element, and a second terminal coupled to a bit-line which is operable to be pre-discharged to a logical low level prior to write operation.

In one embodiment, the apparatus further comprises a logic unit to pre-discharge the bit-line prior to write operation. In one embodiment, the logic unit is operable to pre-discharge the bit-line during a memory inactive state. In one embodiment, the apparatus further comprises a delay unit operable to delay assertion or de-assertion of the bit-line relative to the word-line.

In one embodiment, the power device comprises a p-type device. In one embodiment, the power device comprises a stack of p-type devices coupled together in series between the first supply node and the second supply node. In one embodiment, the power device has a programmable resistance between the first power supply node and the second power supply node. In one embodiment, the power device is operable to receive a pulse signal to turn OFF the power device when the bit-line is pre-discharged to the logical low level during the write operation. In one embodiment, the power device is operable to be turned ON after the bit-line is transitioned to logical high level during the write operation.

In one embodiment, the memory element and the access device are part of a 6T SRAM cell. In one embodiment, the memory element and the access device are part of an 8T SRAM cell. In one embodiment, the cross-coupled inverters comprise corresponding p-type devices with first terminals coupled to the first supply node and second terminals coupled to at least one access device.

In another example, in one embodiment the apparatus comprises: a power device having a p-type transistor operable to supply power supply to a first supply node; and an SRAM memory unit coupled to the first supply node, the SRAM memory unit having at least two access devices having their corresponding gate terminals coupled to a word-line, their corresponding first terminals coupled to cross-coupled inverters of the SRAM memory unit, and corresponding second terminals coupled to complementary bit-lines which are operable to be pre-discharged to a logical low level prior to write operation.

In one embodiment, the apparatus further comprises a logic unit to pre-discharge the complementary bit-lines prior to write operation. In one embodiment, the logic unit is operable to pre-discharge the complementary bit-lines during a memory inactive state.

In one embodiment, the SRAM memory unit is a 6T SRAM memory unit. In one embodiment, the SRAM memory unit is an 8T SRAM memory unit. In one embodiment, the power device is operable to receive a pulse signal to turn OFF the power device when the complementary bit-lines are pre-discharged to the logical low level during the write operation. In one embodiment, the power device is operable to turn ON after one of the complementary bit-lines is transitioned to logical high during the write operation. In one embodiment, the apparatus further comprises a delay unit operable to delay assertion or de-assertion of the complementary bit-lines relative to the word-line.

In another example, in one embodiment a system comprises: a processor having a memory unit comprising: a memory element having cross-coupled inverters coupled to a first supply node; a power device coupled to the first supply node and a second supply node, the second supply node coupled to power supply; and an access device having a gate terminal coupled to a word-line, a first terminal coupled to the memory element, and a second terminal coupled to a bit-line which is operable to be pre-discharged to a logical low level prior to write operation; and a wireless interface communicatively coupled to the processor to allow the processor to communicate with other devices.

In another example, in one embodiment a system comprises a processor having a memory unit comprising: a power device having a p-type transistor to supply power supply to a first supply node; and an SRAM memory unit coupled to the first supply node, the SRAM memory unit having at least two access devices having their corresponding gate terminals coupled to a word-line, wherein the at least two access devices having their corresponding first terminals coupled to cross-coupled inverters of the SRAM memory unit, and wherein the at least two access devices having their corresponding second terminals coupled to complementary bit-lines which are operable to be pre-discharged to a logical low level prior to write operation; and a wireless interface communicatively coupled to the processor to allow the processor to communicate with other devices. In one embodiment, the memory unit is according to the apparatus discussed herein. In one embodiment, the system further comprises a display unit communicatively coupled to the processor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a memory element having cross-coupled inverters coupled to a first supply node;
   a power device coupled to the first supply node and a second supply node, the second supply node coupled to a power supply;
   a first access device having a gate terminal coupled to a word-line, a first terminal coupled to the memory element, and a second terminal coupled to a first bit-line which is operable to be pre-discharged to a logical low level prior to write operation; and
   a second access device having a gate terminal coupled to the word-line, a first terminal coupled to the memory element, and a second terminal coupled to a second bit-line which is operable to be pre-discharged to a logical low level prior to the write operation, wherein the first and second bit-lines are differential bit-lines, and wherein both the first and second bit-lines are operable to be pre-discharged to a logical low level prior to the write operation such that the power supply on the first supply node exhibits self-induced reduction.

2. The apparatus of claim 1 further comprises logic to pre-discharge the first bit-line prior to the write operation.

3. The apparatus of claim 2, wherein the logic is operable to pre-discharge the first bit-line during a memory inactive state.

4. The apparatus of claim 1 further comprises a delay logic operable to delay assertion or de-assertion of the first bit-line relative to the word-line.

5. The apparatus of claim 1, wherein the power device comprises a p-type device.

6. The apparatus of claim 1, wherein the power device comprises a stack of p-type devices coupled together in series between the first supply node and the second supply node.

7. The apparatus of claim 1, wherein the power device has a programmable resistance between the first power supply node and the second power supply node.

8. The apparatus of claim 1, wherein the power device is operable to receive a pulse signal to turn off the power device when the first bit-line is pre-discharged to the logical low level during the write operation.

9. The apparatus of claim 1, wherein the power device is operable to be turned on after the first bit-line transitions to a logical high level during the write operation.

10. The apparatus of claim 1, wherein the memory element and the first and second access devices are part of a 6T Static Random Access Memory (SRAM) cell or part of an 8T SRAM cell.

11. The apparatus of claim 1, wherein during normal operation, the second bit-line provides a signal which is an inverse of a signal provided by the first bit-line.

12. The apparatus of claim 1, wherein the cross-coupled inverters comprise corresponding p-type devices with first terminals coupled to the first supply node and second terminals coupled to at least one of the first or second access devices.

13. An apparatus comprising:
a power device having a p-type transistor operable to supply power supply to a first supply node; and
an Static Random Access Memory (SRAM) coupled to the first supply node, the SRAM having at least two access devices having their corresponding gate terminals coupled to a word-line, the at least two access devices having their corresponding first terminals coupled to cross-coupled inverters of the SRAM, and the at least two access devices having their corresponding second terminals coupled to complementary bit-lines which are operable to be pre-discharged to a logical low level prior to write operation, wherein both bit-lines of the complementary bit-lines are operable to be pre-discharged to a logical low level prior to the write operation such that the power supply on the first supply node exhibits self-induced reduction.

14. The apparatus of claim 13 further comprises logic to pre-discharge the complementary bit-lines prior to the write operation.

15. The apparatus of claim 14, wherein the logic is operable to pre-discharge the complementary bit-lines during a memory inactive state.

16. The apparatus of claim 13, wherein the SRAM is a 6T SRAM or an 8T SRAM.

17. The apparatus of claim 13, wherein during normal operation, the complementary bit-lines provide complementary signals.

18. The apparatus of claim 13, wherein the power device is operable to receive a pulse signal to turn off the power device when the complementary bit-lines are pre-discharged to the logical low level during the write operation.

19. The apparatus of claim 13, wherein the power device is operable to turn on after the complementary bit-lines transition to a logical high level during the write operation.

20. The apparatus of claim 13 further comprises delay logic operable to delay assertion or de-assertion of the complementary bit-lines relative to the word-line.

21. A system comprising:
a processor having memory comprising:
a memory element having cross-coupled inverters coupled to a first supply node;
a power device coupled to the first supply node and a second supply node, the second supply node coupled to a power supply;
a first access device having a gate terminal coupled to a word-line, a first terminal coupled to the memory element, and a second terminal coupled to a first bit-line which is operable to be pre-discharged to a logical low level prior to write operation; and
a second access device having a gate terminal coupled to the word-line, a first terminal coupled to the memory element, and a second terminal coupled to a second bit-line which is operable to be pre-discharged to a logical low level prior to the write operation, wherein the first and second bit-lines are differential bit-lines, and wherein both the first and second bit-lines are operable to be pre-discharged to a logical low level prior to the write operation such that the power supply on the first supply node exhibits self-induced reduction; and
a wireless interface communicatively coupled to the processor to allow the processor to communicate with other devices.

22. The system of claim 21 further comprises a display unit communicatively coupled to the processor.

23. The system of claim 21, wherein the processor further comprises logic to pre-discharge the first and second bit-lines prior to the write operation.

24. The system of claim 23, wherein the logic is operable to pre-discharge the first and second bit-lines during a memory inactive state.

25. The system of claim 21, wherein the processor further comprises a delay logic operable to delay assertion or de-assertion of the first bit-line relative to the word-line.

26. A system comprising:
a processor having a memory comprising:
a power device having a p-type transistor to supply power supply to a first supply node; and
an Static Random Access Memory (SRAM) coupled to the first supply node, the SRAM having at least two access devices having their corresponding gate terminals coupled to a word-line, the at least two access devices having their corresponding first terminals coupled to cross-coupled inverters of the SRAM, and the at least two access devices having their corresponding second terminals coupled to complementary bit-lines which are operable to be pre-discharged to a logical low level prior to write operation, wherein both bit-lines of the complementary bit-lines are operable to be pre-discharged to a logical low level prior to the write operation such that the power supply on the first supply node exhibits self-induced reduction; and
a wireless interface communicatively coupled to the processor to allow the processor to communicate with other devices.

27. The system of claim 26, wherein the processor further comprises logic to pre-discharge the complementary bit-lines prior to the write operation.

28. The system of claim 27, wherein the logic is operable to pre-discharge the complementary bit-lines during a memory inactive state.

29. The system of claim 28, wherein the SRAM is a 6T SRAM or an 8T SRAM.

30. The system of claim 26 further comprises a display unit communicatively coupled to the processor.

31. The apparatus of claim 4, wherein the delay between the first bit-line and word-line is programmable.

32. The apparatus of claim 4, wherein the delay unit is operable to set the delay between the first bit-line and the word-line in a range of 20% to 30% of a write clock phase.

33. The apparatus of claim 4, wherein the delay unit comprises a multiplexer which is operable to select an inverting path over a non-inverting path.

* * * * *